United States Patent
Canfield et al.

(10) Patent No.: US 9,826,659 B2
(45) Date of Patent: *Nov. 21, 2017

(54) POSITIVE PRESSURE-APPLYING LATCH MECHANISM

(71) Applicant: INTERNATIONAL BUSINESS MACHINES CORPORATION, Armonk, NY (US)

(72) Inventors: Shawn Canfield, Poughkeepsie, NY (US); Robert R. Genest, Poughkeepsie, NY (US); Robert K. Mullady, Poughkeepsie, NY (US); Michael T. Peets, Staatsburg, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/409,884

(22) Filed: Jan. 19, 2017

(65) Prior Publication Data

US 2017/0135243 A1    May 11, 2017

Related U.S. Application Data

(63) Continuation of application No. 15/176,626, filed on Jun. 8, 2016, which is a continuation of application
(Continued)

(51) Int. Cl.
*H05K 7/00* (2006.01)
*H05K 7/14* (2006.01)

(52) U.S. Cl.
CPC ......... *H05K 7/1489* (2013.01); *H05K 7/1409* (2013.01); *H05K 7/1417* (2013.01)

(58) Field of Classification Search
CPC .................................................. H05K 7/1411
(Continued)

(56) References Cited

U.S. PATENT DOCUMENTS 3,575,482 A * 4/1971 MacMaster .......... H05K 7/1411
312/332.1
4,885,436 A    12/1989 Pham et al.
(Continued)

FOREIGN PATENT DOCUMENTS

| DE | 10204180 C1 | 2/2002 |
| EP | 1032085 A2 | 8/2000 |
| JP | 2008074725 A | 10/2008 |

OTHER PUBLICATIONS

Canfield et al., Office Action for U.S. Appl. No. 14/178,395, filed Feb. 12, 2014 (U.S. Pat. No. 9,433,119 B1), dated Nov. 4, 2015 (15 pages).
(Continued)

*Primary Examiner* — Jerry Wu
(74) *Attorney, Agent, or Firm* — Margaret A. McNamara, Esq.; Kevin P. Radigan, Esq.; Heslin, Rothenberg Farley & Mesiti

(57) ABSTRACT

A latch mechanism is provided for latching a field-replaceable unit within an enclosure. The latch mechanism includes a pivotable latch coupled to the field-replaceable unit via a pivot, at a first side of the unit, and a spring member associated with the enclosure. The spring member is engaged by the latch and deflects with rotating of the latch from an open position to a latched position. The pivotable latch includes the first end and a second end, with the pivot being disposed closer to the first end than the second. The deflecting spring member facilitates provision of positive pressure on the unit directed towards a second side of the unit opposite to the first side to facilitate, for example, fixedly coupling a first connector at the second side to a
(Continued)

second connector associated with the enclosure when the unit is latched within the enclosure.

14 Claims, 11 Drawing Sheets

Related U.S. Application Data

No. 14/178,395, filed on Feb. 12, 2014, now Pat. No. 9,433,119.

(58) Field of Classification Search
USPC .................................................. 361/679.01
See application file for complete search history.

(56) References Cited

U.S. PATENT DOCUMENTS

| | | | |
|---|---|---|---|
| 5,035,634 | A | 7/1991 | Hasircoglu et al. |
| 5,135,408 | A | 8/1992 | Suzuki |
| 5,208,735 | A | 5/1993 | Twachtmann et al. |
| 5,344,194 | A | 9/1994 | Hatagishi et al. |
| 5,823,809 | A | 10/1998 | Wakata |
| 6,125,017 | A | 9/2000 | Misso et al. |
| 6,185,106 | B1 | 2/2001 | Mueller |
| 6,210,193 | B1 | 4/2001 | Ito et al. |
| 6,300,784 | B1 | 10/2001 | Yamamoto |
| 6,418,027 | B1 | 7/2002 | Suzuki et al. |
| 6,515,866 | B2 | 2/2003 | Ulrich |
| 6,572,391 | B2 | 6/2003 | Mochizuki et al. |
| 7,465,181 | B1 | 12/2008 | Bridges et al. |
| 7,503,795 | B2 | 3/2009 | Yamaji et al. |
| 8,289,707 | B2 | 10/2012 | Liao et al. |
| 8,638,563 | B2 | 1/2014 | Peng et al. |
| 2009/0070971 | A1 | 3/2009 | Kamada et al. |
| 2009/0086456 | A1 | 4/2009 | Milo et al. |
| 2009/0279248 | A1 | 11/2009 | Baker et al. |
| 2009/0279249 | A1 | 11/2009 | Crippen et al. |
| 2010/0261371 | A1 | 10/2010 | Morinari |
| 2011/0171844 | A1 | 7/2011 | Chen |
| 2013/0265695 | A1 | 10/2013 | Canfield et al. |
| 2015/0230353 | A1 | 8/2015 | Canfield et al. |
| 2015/0230360 | A1 | 8/2015 | Canfield et al. |

OTHER PUBLICATIONS

Canfield et al., Final Office Action for U.S. Appl. No. 14/178,395, filed Feb. 12, 2014 (U.S. Pat. No. 3,433,119 B1), dated Mar. 4, 2016 (18 pages).

Canfield et al., Office Action for U.S. Appl. No. 14/538,189, filed Nov. 11, 2014 (U.S. Patent Publication No. 2015/0230353 A1), dated Mar. 3, 2016 (13 pages).

Canfield et al., Final Office Action for U.S. Appl. No. 14/538,189, filed Nov. 11, 2014 (U.S. Patent Publication No. 2015/0230353 A1), dated Aug. 4, 2016 (12 pages).

Fahy et al., "Designing for Manufacturing: Don't Forget the Access Hardware", Machine Design, Oct. 5, 2000 (http://machinedesign.com/print/archive/designing-manufacturing-dont-forget-access-hardware), (9 pages).

Canfield et al., Non-Final Office Action for U.S. Appl. No. 15/176,626, filed Jun. 8, 2016, dated Mar. 7, 2017 (13 pages).

* cited by examiner

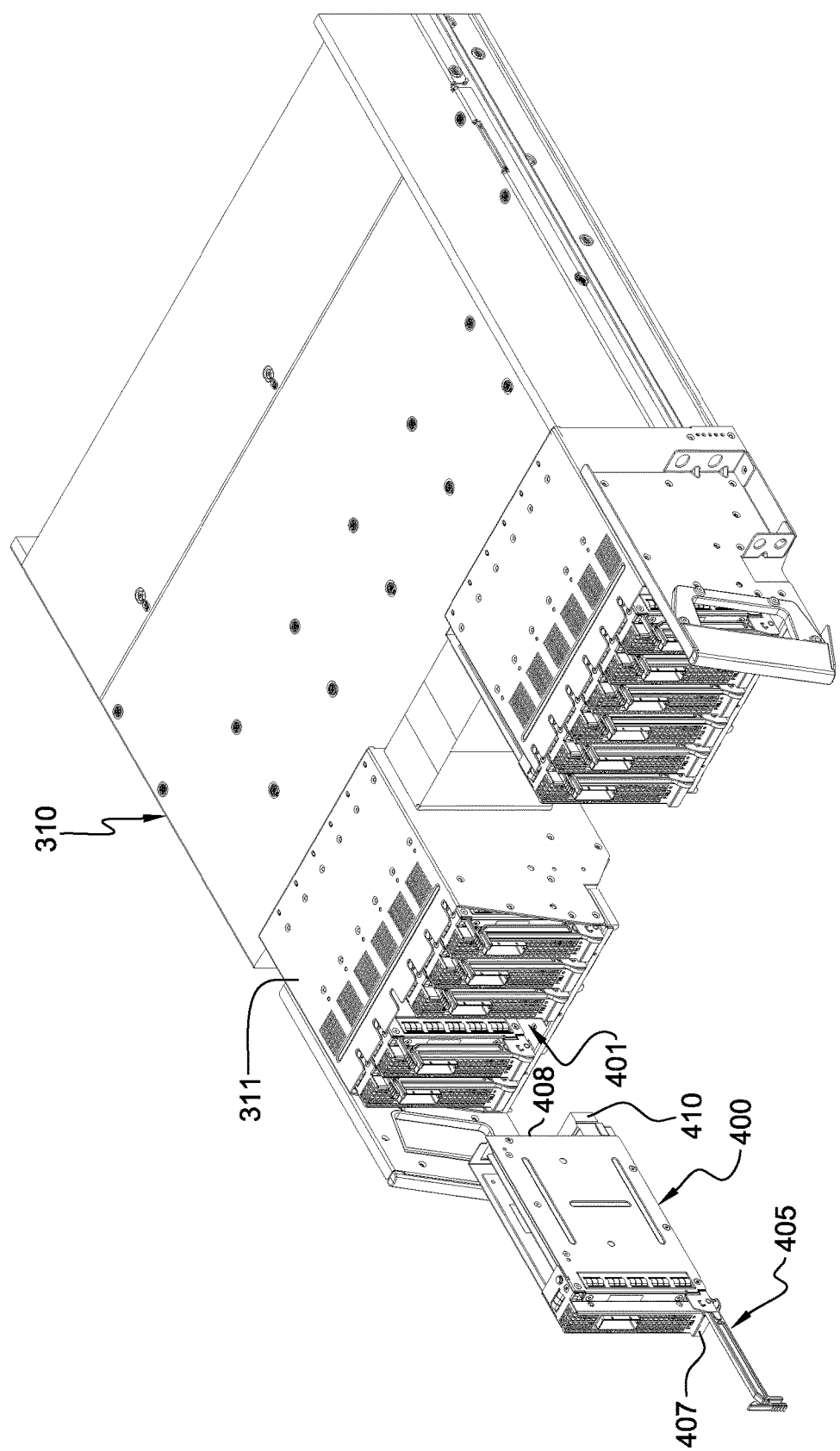

POSITIVE PRESSURE-APPLYING LATCH MECHANISM

CROSS-REFERENCE TO RELATED APPLICATIONS

This application is a continuation of U.S. Ser. No. 15/176,626, filed Jun. 8, 2016, and entitled "Positive Pressure-Applying Latch Mechanism", which is a continuation of U.S. Ser. No. 14/178,395, filed Feb. 12, 2014, entitled "Positive Pressure-Applying Latch Mechanism", which issued on Aug. 30, 2016, as U.S. Pat. No. 9,433,119 B2. Each of these applications is hereby incorporated by reference herein in its entirety.

BACKGROUND

A field-replaceable unit (FRU), also referred to as a customer-replaceable unit (CRU), may comprise a circuit board, part or assembly that can be readily removed from an electronics enclosure (or chassis), such as a computer, mainframe, or other piece of electronic equipment, and replaced by a user or technician without having to send the entire electronics enclosure or system to a repair facility. For example, field-replaceable units allow a technician lacking an in-depth product knowledge of a particular system to fault isolate and replace a faulty component or unit. Field-replaceable units are not strictly confined to computers, but also may comprise part of many higher-end consumer and commercial electronic products.

As the sophistication and complexity of multi-replaceable unit electronics in both commercial and consumer industries has increased, many design and manufacturing organizations have expanded the use of field-replaceable units to, for example, input/output devices, control devices, storage devices, etc. As one example, one or more field-replaceable units may be employed as input/output, control, or storage within an electronic system or rack. In such a field-replaceable unit, a first connector associated with the unit couples to a second connector associated with the enclosure as the field-replaceable unit is docked within the enclosure. Positive pressure or force can be applied on the first connector to the second connector by, for example, mechanical fasteners. However, the use of mechanical fasteners to (for example) ensure positive force on the connectors requires the use of tools, which adds complexity to the field replaceability of the field-replaceable unit.

SUMMARY

The shortcomings of the prior art are overcome and additional advantages are provided through the provision, in one aspect, of a method, which includes providing a pivotable latch coupled to a unit via a pivot. The pivot is disposed at a first side of the unit, and the unit is to be latched within an enclosure. The method further includes providing a spring member associated with the enclosure, and separate from the pivotable latch. The spring member is contacted by, and has a tension force applied thereto by, a first end of the pivotable latch with rotating of the latch from an open position to a latched position during latching of the unit within the enclosure. The pivotable latch includes the first end and a second end, and the pivot is disposed closer to the first end than the second end thereof. Rotating of the latch from the open position to the latched position during latching of the unit within the enclosure results in the latch contacting the spring member, and slidably deflecting a first end and a second end of the spring member away from each other in opposite directions, thereby facilitating provision of a positive pressure on the unit by the pivotable latch directed towards a second side of the unit opposite the first side thereof with latching of the unit within the enclosure.

In a further aspect, a method of facilitating secure latching of a field-replaceable unit (FRU) within an enclosure is provided. The method incudes providing a latch mechanism to facilitate secure latching of the field-replaceable unit within the enclosure. The latch mechanism includes a pivotable latch coupled to the field-replaceable unit via a pivot, where the pivot is disposed at a first side of the field-replaceable unit. Further, the latch mechanism includes a spring member associated with the enclosure and separate from the pivotable latch. The spring member is contacted by, and has a tension force applied thereto by, a first end of the pivotable latch with rotating of the latch from an open position to a latched position during latching of the field-replaceable unit within the enclosure. The pivotable latch includes the first end and a second end, and the pivot is disposed closer to the first end than the second end thereof. The rotating of the latch from the open position to the latched position during latching of the field-replaceable unit within the enclosure results in the latch contacting the spring member, and slidably deflecting a first end and a second end of the spring member away from each other in opposite directions, thereby facilitating provision of a positive pressure on the field-replaceable unit by the pivotable latch directed towards a second side of the field-replaceable unit opposite the first side thereof with latching of the field-replaceable unit within the enclosure.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 4 depicts the electronic subsystem of FIG. 3, and illustrates one embodiment of a field-replaceable unit (FRU), to be slidably docked into a respective FRU-receiving slot in the enclosure, in accordance with one or more aspects of the present invention;

DETAILED DESCRIPTION

As used herein, the terms "electronics rack", and "rack" are used interchangeably, and unless otherwise specified include any housing, frame, rack, compartment, blade server system, etc., having one or more components of a computer system or electronics system, and may be, for example, a stand-alone computer server unit having high, mid or low end processing capability. In one embodiment, an electronics rack may comprise at least one electronic subsystem, one or more of which accommodate one or more field-replaceable units. "Electronic subsystem" refers to any sub-housing, enclosure, blade, book, drawer, node, compartment, etc., having one or more electronic components disposed therein. An electronic subsystem of an electronics rack may be movable or fixed relative to the electronics rack. As one example, one or more electronic subsystems within the electronics rack may be server units requiring additional input/output, control, and/or computer storage capability. As one specific example, the electronics rack may be an IT Enterprise Computer System, implemented, for example, employing System z server units, or System p server units, offered by International Business Machines Corporation. System z and System p are trademarks of International Business Machines Corporation, of Armonk, N.Y.

Further, as used herein, "enclosure" comprises any housing, chassis, frame, container, etc., configured to accommodate one or more components of, for example, a computer system, an electronic system, or electronic subsystem. Further, "field-replaceable unit" is used herein to comprise any insertable, removable, and/or replaceable component, such as a modular component, which may be docked to or undocked from an enclosure. Note that the input/output and control sleds or assemblies discussed herein present only two examples of a field-replaceable unit with which the disclosed latching mechanism may be employed. Still further, a "connector" refers to any connect structure or assembly employed to render the field-replaceable unit operable within the enclosure, and may comprise an electrical, electronic or communication connector, etc.

Reference is made below to the drawings, which are not drawn to scale for ease of understanding, wherein the same reference numbers used throughout different figures designate the same or similar components.

Figure 1:
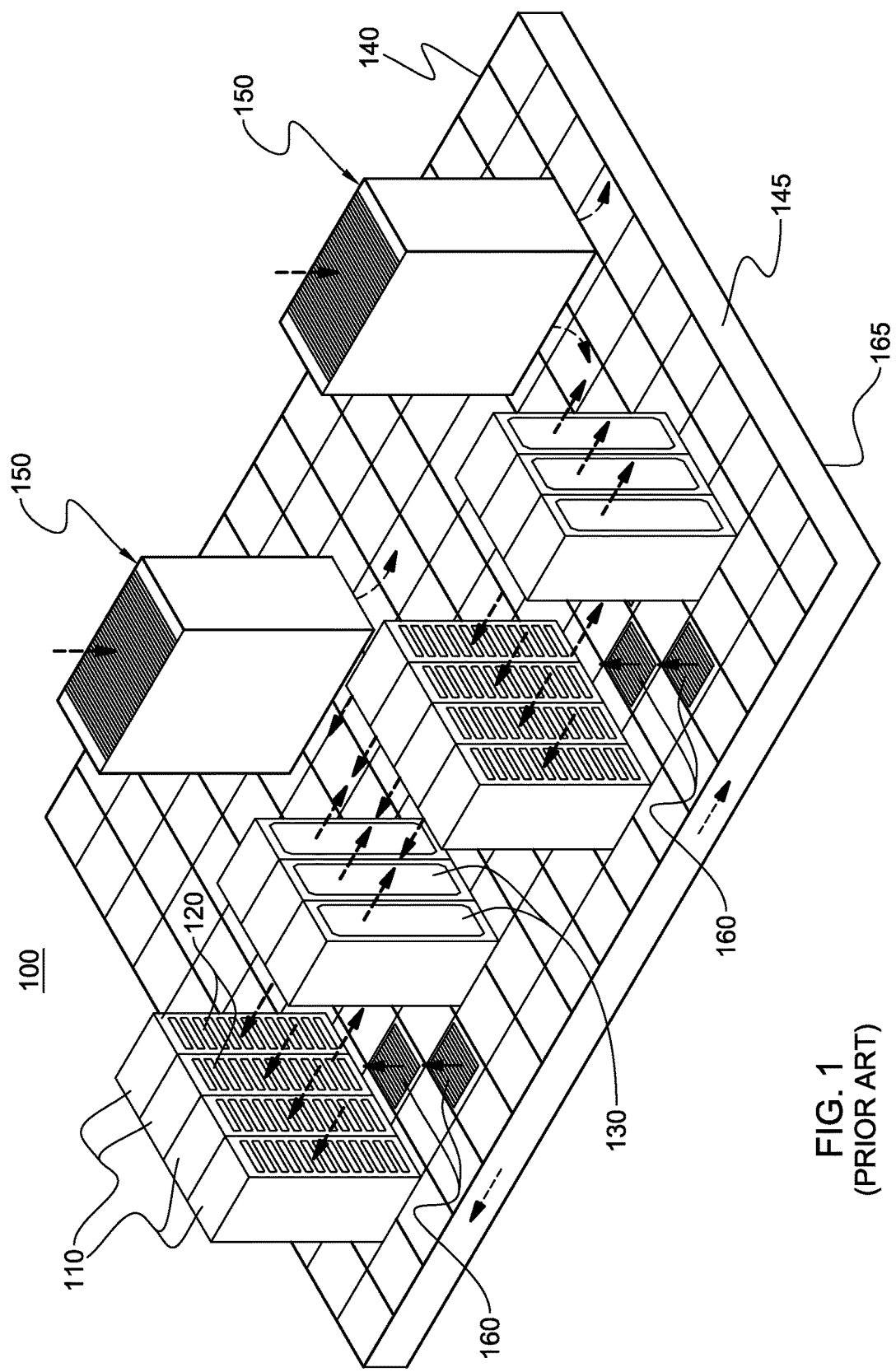
FIG. 1 depicts one embodiment of a conventional raised floor layout of a computer installation comprising multiple electronics racks.

FIG. 1 depicts a raised floor layout of a data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at the front (i.e., air inlet sides 120) of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2:
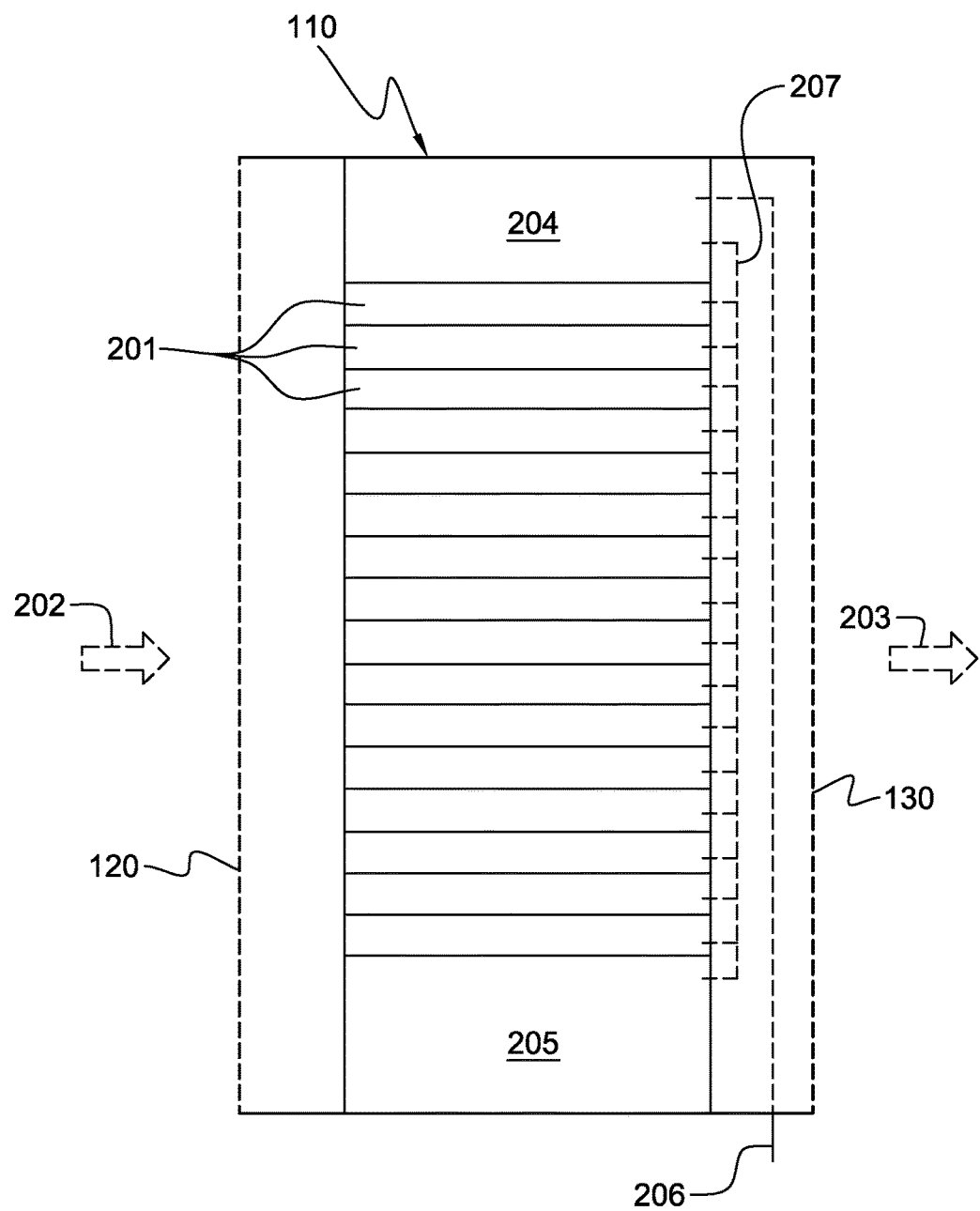
FIG. 2 is a cross-sectional elevational view of one embodiment of an electronics rack comprising, in one embodiment, one or more electronic subsystems configured to accommodate one or more field-replaceable units which may employ latching mechanisms, in accordance with one or more aspects of the present invention.

FIG. 2 is an elevational representation of one embodiment of a an electronics rack 110. In the embodiment shown, electronics rack 110 includes a plurality of electronic subsystems 201, which (in the embodiment illustrated) are air-cooled by cool air 202 ingressing via louvered air inlet door 210, and exhausting out louvered air outlet door 211 as hot air 203. Electronics rack 110 also includes (in one embodiment) at least one bulk power assembly 204. One or more electronic subsystems 201 include, in one example, one or more processors, associated memory, input/output adapters, controllers, and disk storage devices. Also illustrated in FIG. 2 is an I/O and disk expansion subsystem 205, which includes, in one detailed example, PCIe card slots, flexible service processor (FSP) slots, or disk drivers for one or more electronic subsystems of the electronics rack. Note that I/O and disk expansion subsystem 205 could be disposed anywhere within electronics rack 110, with the positioning shown in FIG. 2 being provided as one example only. For example, the I/O and disk expansion subsystem 205 could alternatively be disposed in the middle of the electronics rack, if desired.

In one rack example, a three-phase AC source feeds power via an AC power cord 206 to bulk power assembly 204, which transforms the supplied AC power to an appropriate DC power level for output via distribution cables 207 to the plurality of electronics subsystems 201. AC power cord 206 supplies, in one example, three phase electrical power. The number and type of electronic subsystems installed in the electronics rack are variable and depend on customer requirements for a particular system.

As noted initially, field-replaceable units have the advantage of being able to be readily added, removed and/or replaced in a system, without having to send the entire system to a repair facility. Further, the modular nature of field-replaceable units allows for tailoring of system configuration and subsequent system expansion as needed for a particular application. For example, a portion of an electronic subsystem enclosure may be configured to accommodate an expandable number of input/output and/or control assemblies as field-replaceable units.

Figure 3:
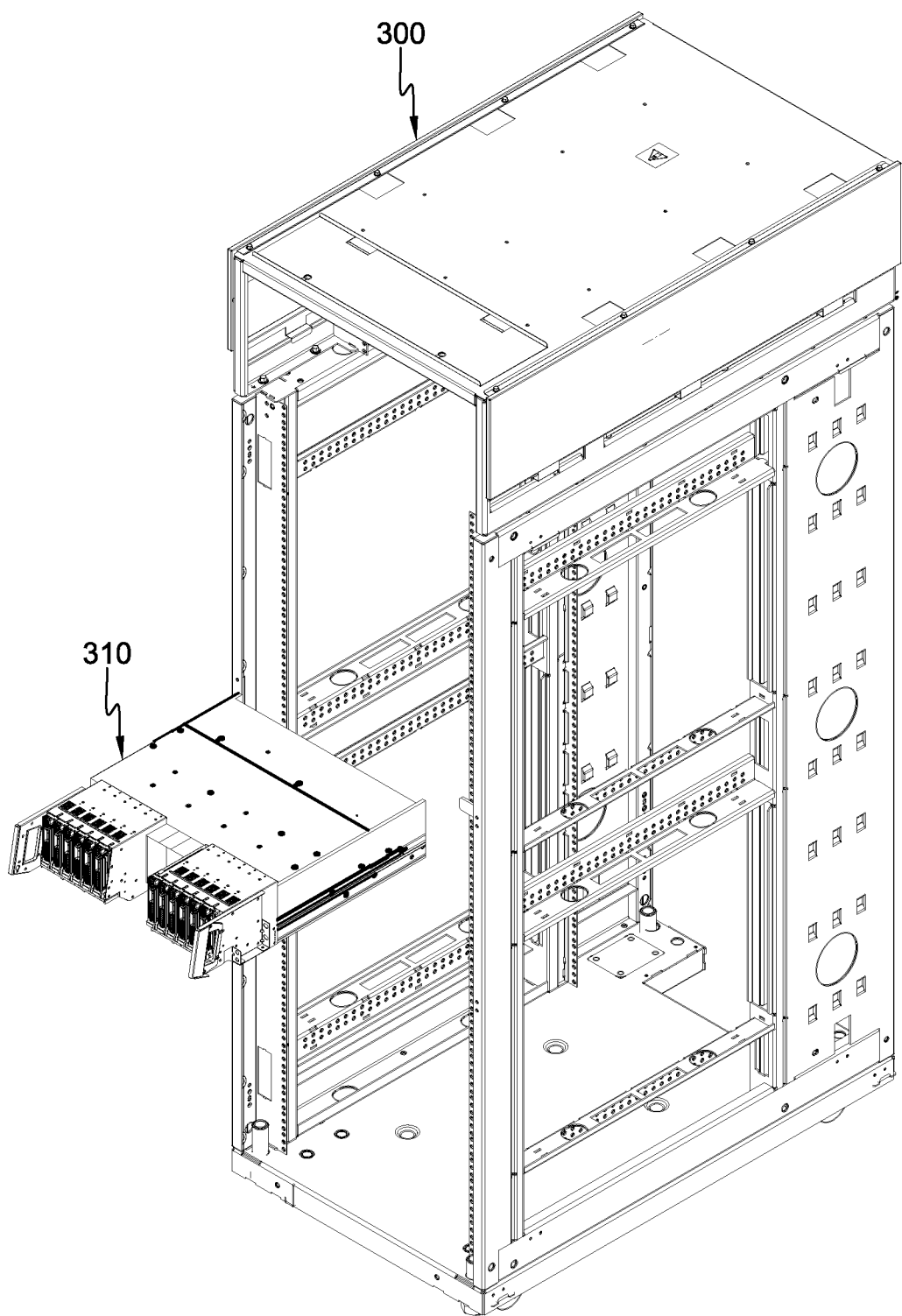
FIG. 3 depicts one embodiment of a rack frame and an electronic subsystem comprising an enclosure configured to receive multiple field-replaceable units to be latched therein, in accordance with one or more aspects of the present invention.

Referring collectively to FIGS. 3-4, in one embodiment, an electronic system may comprise a rack frame 300, which accommodates a plurality of electronic subsystems, with one electronic subsystem 310 being illustrated, by way of example. Electronic subsystem 310 comprises one or more enclosures 311 configured to accommodate, at least in part, a plurality of field-replaceable units 400 (FIG. 4), which slidably dock within respective field-replaceable unit (FRU)-receiving slots 401 at, in this example, one end of enclosure 311. In FIG. 4, the cover of electronics enclosure 311 has been partially removed to expose (in this embodiment) multiple subsystems with multiple field-replaceable units.

Disclosed herein is a latch mechanism 405 (FIG. 4) which facilitates secure, positive pressure latching of a field-replaceable unit 400 within an FRU-receiving slot 401 of enclosure 311, as described further below. This latch mechanism 405 is disposed at a first side or end 407 of field-replaceable unit 400. A connector assembly may also be provided comprising at least one first connector 410 at a second side or end 408 of the field-replaceable unit 400, and at least one second connector 610 (FIGS. 6A & 6B) associated with enclosure 311, for example, mounted to a mid-plane 600 within the enclosure (see FIGS. 6A & 6B). With slidable docking of field-replaceable unit 400 within an FRU-receiving slot 401, contacts within the at least one first connector 410 electrically connect to respective contacts within the at least one second connector 610 of the connector assembly, thereby ensuring operational coupling of the field-replaceable unit 400 within the electronic subsystem 310.

Note that the depicted subsystems with six vertically-inserted, field-replaceable units, is presented by way of example only. Also note that latch mechanism 405 may be employed with each field-replaceable unit, or only selected field-replaceable units, depending upon the implementation. In general, the latch mechanism disclosed herein may be employed with any unit where a positive pressure on the unit directed from a first side towards a second side thereof is desired with latching of the unit within the enclosure. This positive pressure advantageously ensures fixed mechanical and electrical connection of, for example, the at least one first connector and the at least one second connector of a connector assembly. More particularly, positive pressure advantageously ensures, for example, that during shipping or operation, any vibration of the electronic subsystem does not cause connector contacts to move in relation to each other, which might otherwise cause wearing of the contacts, and possibly result in failure or intermittent failure of the electronic subsystem. Further, the latch mechanism disclosed herein advantageously facilitates the addition, removal and/or replacement of a unit within a system. For example, the latch mechanism can facilitate in-field upgrading of a system through the ready addition of further units to the system.

Figure 5A:
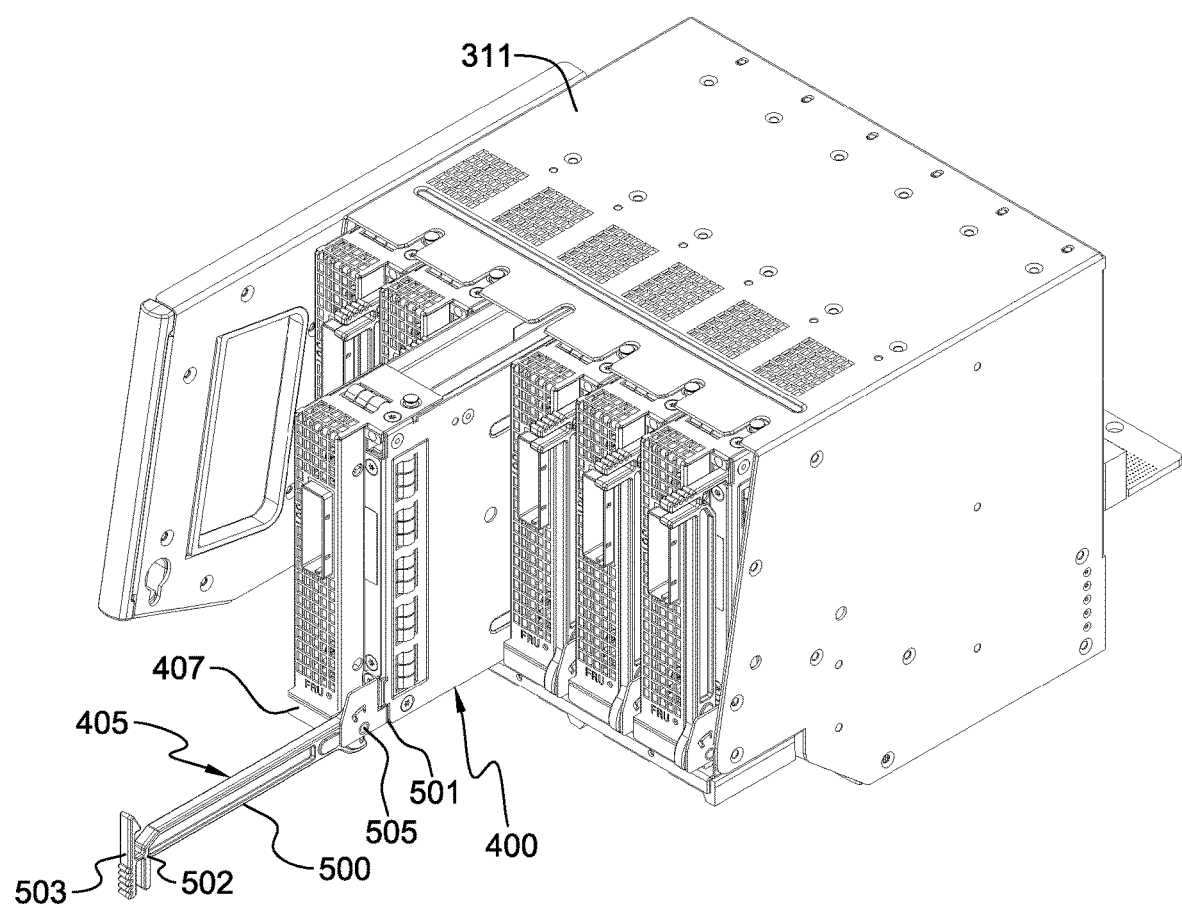
FIG. 5A is an enhanced, partial depiction of the electronic subsystem of FIG. 4, with one field-replaceable unit thereof partially inserted into a respective FRU-receiving slot in the enclosure, in accordance with one or more aspects of the present invention.
Figure 5B:
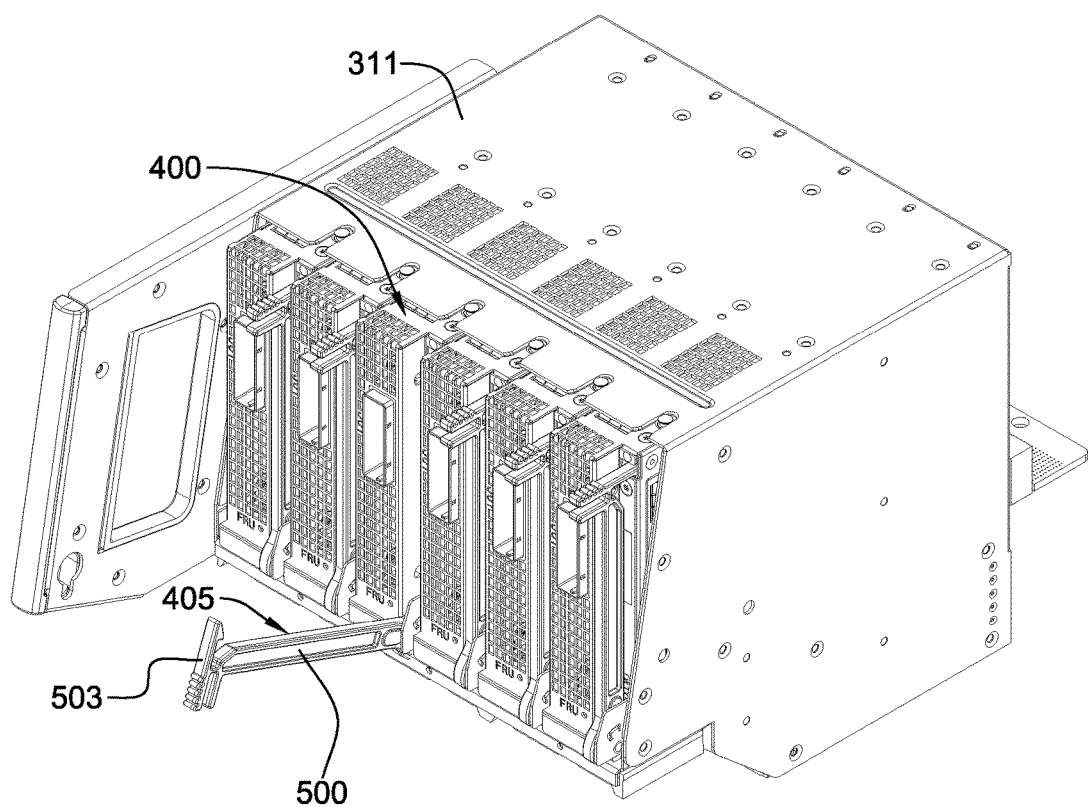
FIG. 5B depicts the electronic subsystem of FIG. 5A, with the field-replaceable unit positioned within the respective FRU-receiving slot of the enclosure and the pivotable latch in open position, starting to be pivoted towards a vertical, latched position, in accordance with one or more aspects of the present invention.

Referring collectively to FIGS. 5A-5F, latch mechanism 405 comprises, in one embodiment, a pivotable latch 500 coupled to a field-replaceable unit 400 via a pivot 505 disposed closer to a first end 501 of pivotable latch 500 than a second end 502 thereof. FIG. 5A depicts slidable insertion (or removal) of field-replaceable unit 400 into a corresponding FRU-receiving slot in enclosure 311. In this depiction, pivotable latch 500 of the partially inserted field-replaceable unit is shown in open position. In FIG. 5B, the field-replaceable unit 400 is substantially docked within the corresponding FRU-receiving slot, but is yet to be fully connected and latched into place within the FRU-receiving slot. In this figure, pivotable latch 500 is shown partially pivoted from open position towards latched position.

Figure 5C:
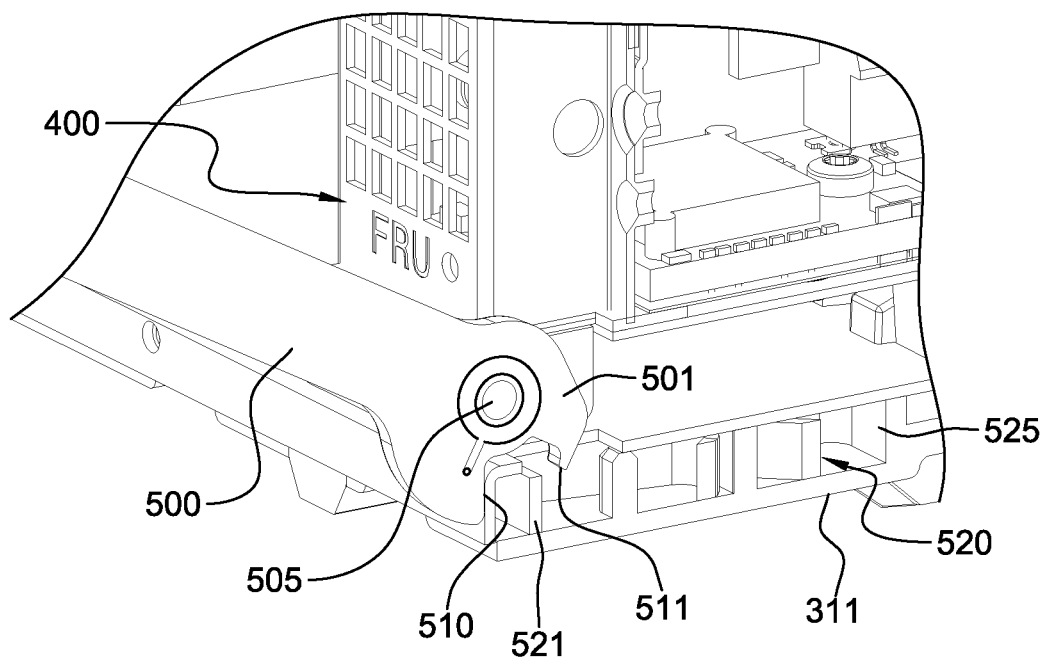
FIG. 5C is a partial, cut-away view of the latch, field-replaceable unit, and enclosure of FIG. 5B, showing the latch about to engage a spring member below the FRU-receiving slot in the enclosure within which the field-replaceable unit is being docked, in accordance with one or more aspects of the present invention.

As shown in the enlarged, partial cross-sectional depiction of FIG. 5C, in one embodiment, first end 501 of latch 500 may include an enlarged region with a first surface 510 and a second surface 511 defined, for instance, via a substantially U-shaped recess or cut-out in an enlarged region of latch 500 at first end 501 thereof. First contact surface 510 may be disposed and configured as a latch stop to physically contact a front surface of enclosure 311 when the unit is docked and the latch is in the open position, and second surface 511 may be disposed and configured to engage a portion of a spring member 520, such as a base 521 of spring member 520, which in this embodiment, is disposed within an appropriately-configured recess 525 or space associated with enclosure 311.

Figure 5D:
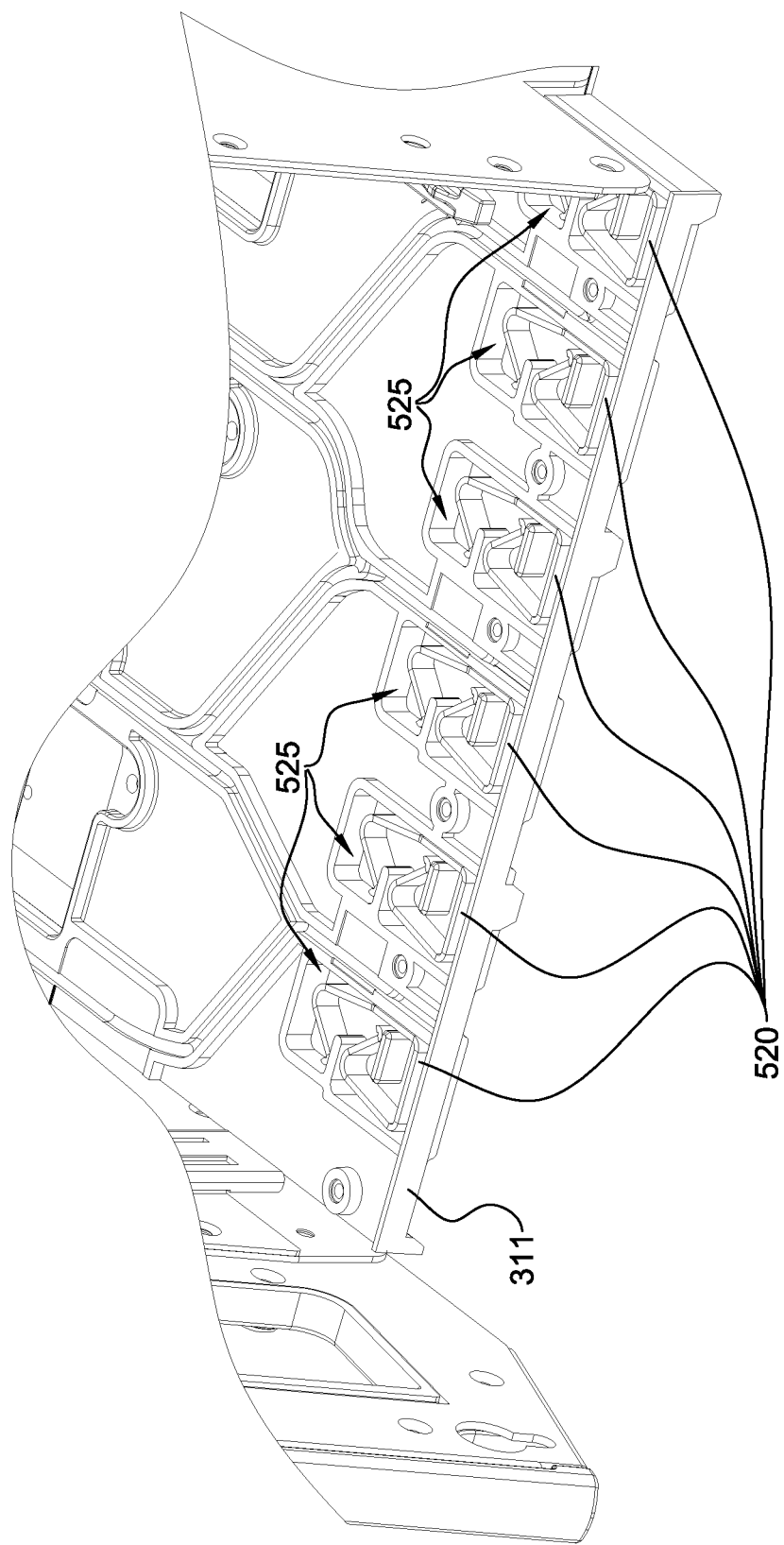
FIG. 5D depicts positioning of spring members within recesses or housings in the enclosure beneath respective FRU-receiving slots of the electronic subsystem enclosure of FIGS. 5A-5C, in accordance with one or more aspects of the present invention.

By way of example, FIG. 5D depicts six spring members 520 disposed within corresponding recesses 525 in enclosure 311. These recesses and spring members are, in the depicted embodiment, aligned beneath six corresponding FRU-receiving slots of the enclosure (see FIGS. 4-5B) so that the respective pivotable latches of the latch mechanisms associated with the field-replaceable units may engage and deflect the respective spring member with rotating of the latch from an open position to a latched position during latching of the respective unit within the enclosure.

Figure 5E:
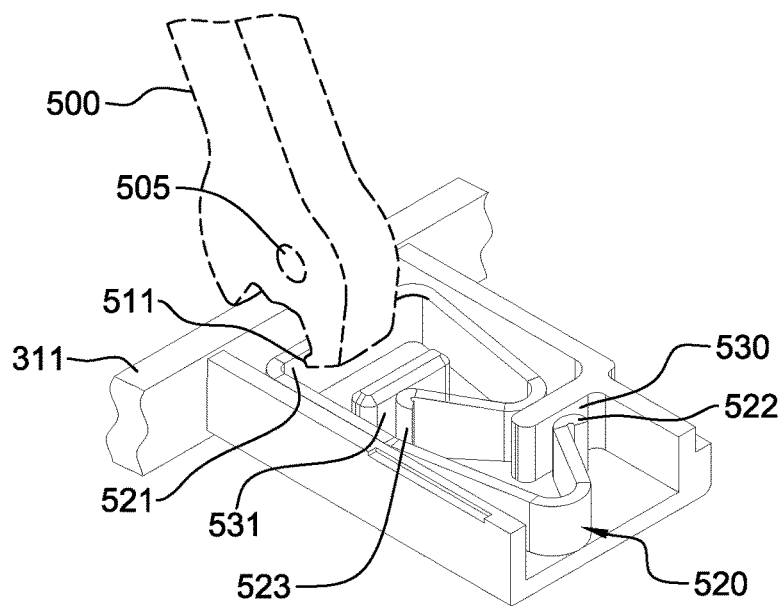
FIG. 5E is a partial depiction of the pivotable latch initially engaging the spring member of the latch mechanism, with the spring member shown undeflected position, in accordance with one or more aspects of the present invention.
Figure 5F:
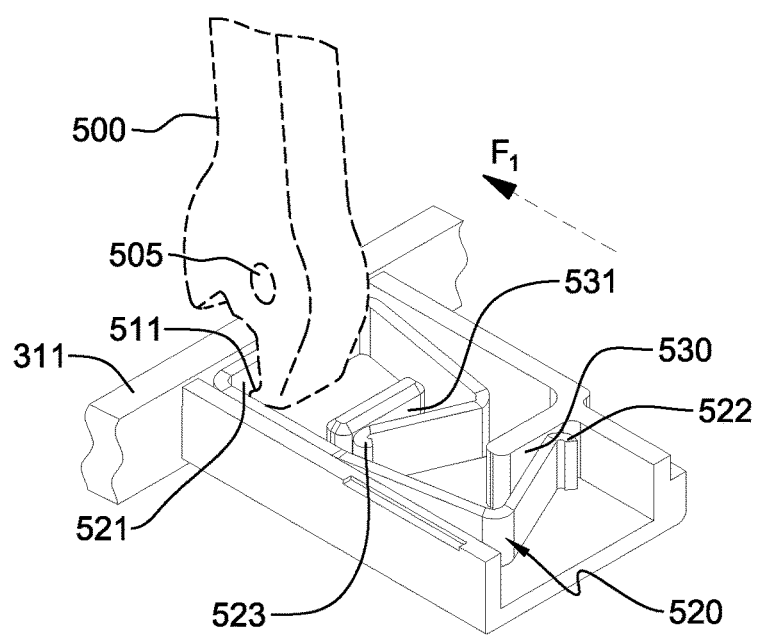
FIG. 5F depicts the partial assembly of FIG. 5E, with the latch pivoted to a latched position, and showing the spring member deflected, in accordance with one or more aspects of the present invention.

FIGS. 5E & 5F depict in greater detail one embodiment of spring member 520, with the spring member shown un-deflected in FIG. 5E, and deflected in FIG. 5F (with reactive energy stored therein). As noted, in one embodiment, base 521 of spring member 520 is engaged by second surface 511 at first end 501 of pivotable latch arm 500 with rotating of the latch arm from open position to a latched position during docking of the field-replaceable unit within the respective FRU-receiving slot of the enclosure. As second surface 511 engages base 521, spring member 520 deflects due to the pulling force acting upon it in a direction $F_1$. This pulling results in a reactive force which is translated through the pivotable latch towards a second side of the unit (opposite to the first side thereof) with latching of the unit within the enclosure.

In the embodiment illustrated, spring member 520 is, for instance, a metal tension spring with a first curved spring end 522 and a second curved spring end 523. Respective contact surfaces 530, 531 are part of or associated with enclosure 311, and may comprise, for instance, plate segments which are physically, slidably contacted by the respective first and second curved spring ends, 522, 523 during deflection of the spring member due to latch 500 pulling on base 521 thereof. In the embodiment illustrated, spring member 520 extends from base 521 past contact surface 530 and curves back thereto so that first curved spring end 522 is (for instance) in slidable, physical contact with first contact surface 530, and extends from base 521 past second contact surface 531 and curves back thereto such that, as the spring deflects, second curved spring end 523 is in (for instance) slidable, physical contact with second contact surface 531. In this configuration, spring member 520 is substantially a G-shaped, curved spring member (which is inverted in the plan view depicted).

As illustrated in FIG. 5F, with drawing or pulling of base 521 in direction $F_1$, the spring deflects with first and second curved spring ends 522, 523 sliding (in one embodiment) in opposite directions relative to the respective contact surfaces 530, 531, storing energy in the spring member, which provides a reactive force that is translated along the vertical length of pivotable latch 500 against the first side of field-replaceable unit 400 when latched, thereby providing a positive pressure on the field-replaceable unit by the pivotable latch and spring assembly. This positive pressure is directed towards the second side of the unit, that is, in a direction opposite to direction of force $F_1$ applied to the spring. This positive pressure is maintained, in part, via actuation of a releasable catch (e.g., clip) 503 (see FIGS. 5A & 5B) at second end 502 of pivotable latch 500 to engage an appropriate surface, structure, etc., associated with enclosure 311. For instance, releasable catch 503 could engage a lip near a front edge of enclosure 311 above the respective FRU-receiving slot into which the field-replaceable unit is being slidably inserted. The positive pressure (or pre-load) facilitates operative docking of the field-replaceable unit within the FRU-receiving slot through, in part, connection of the first and second connectors of a connection assembly associated with the field-replaceable unit and the enclosure, which is illustrated further below with respect to FIGS. 6A & 6B.

Figure 6A:
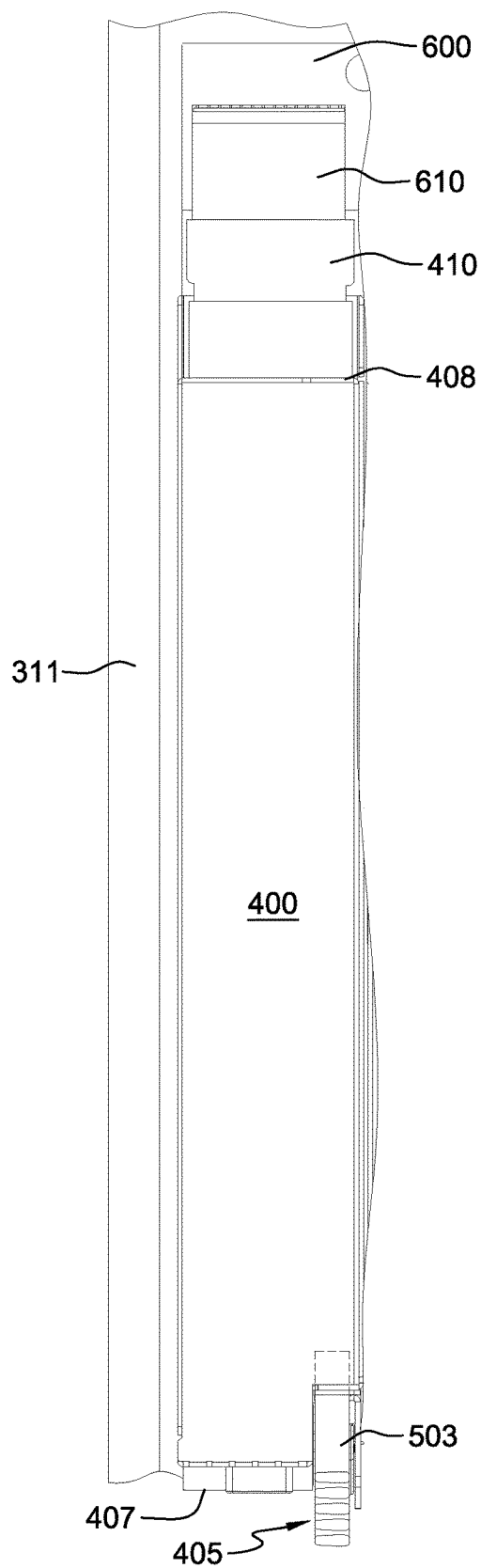
FIG. 6A is a top plan view of one embodiment of a field-replaceable unit docked and latched within a respective FRU-receiving slot in the enclosure of the electronic subsystem of FIG. 4, in accordance with one or more aspects of the present invention.
Figure 6B:
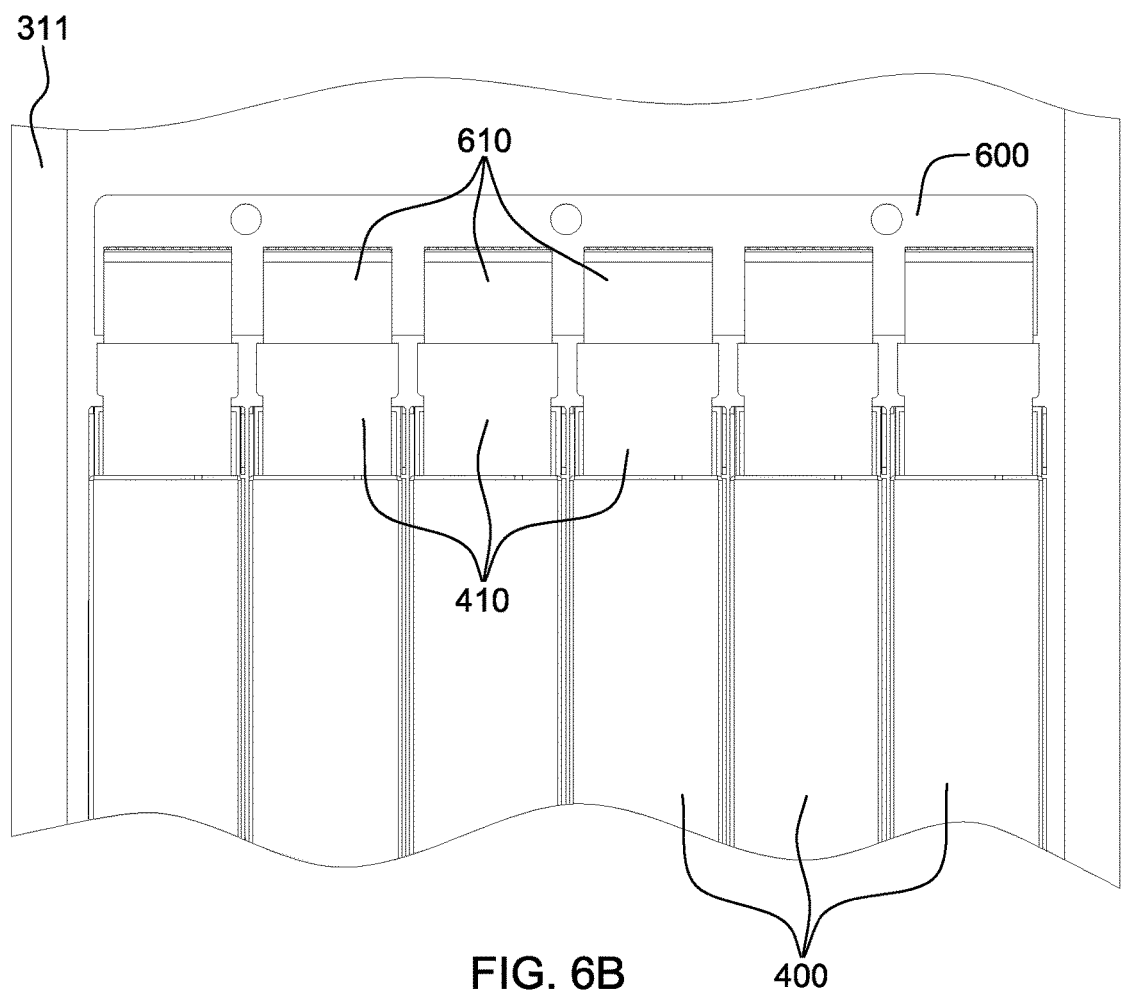
FIG. 6B is a top plan view of the electronic subsystem of FIGS. 4-6A, with six field-replaceable units docked and latched therein and illustrating coupling of first connectors of the field-replaceable units to respective second connectors mounted to, for instance, a mid plane disposed within the enclosure, in accordance with one or more aspects of the present invention.

FIGS. 6A & 6B are plan depictions of a single latched, field-replaceable unit and a plurality of latched, field-replaceable units, respectively, of the electronic subsystem described above in relation to FIGS. 3-5F. In this example, six field-replaceable units 400 are operationally docked within respective, vertically aligned FRU-receiving slots of the electronics enclosure 311. Referring to FIG. 6A, one field-replaceable unit 400 is shown in docked position, with latch mechanism 405 in latched position, at first side 407 of the field-replaceable unit 400, and with first connector(s) 410 at second side 408 operatively coupled to second connectors 610 residing on, for example, a mid-plane board 600 disposed within enclosure 311 of the electronic subsystem. In FIG. 6B, six field-replaceable units 400 are shown operationally docked within respective FRU-receiving slots of the electronics enclosure, with the first connector(s) 410 thereof operatively coupled to respective second connectors 610 coupled to, or residing on, a board, such as a mid-plane board of the electronic subsystem.

As illustrated in FIG. 6A, latch mechanism 405 includes catch 503, which physically engages a respective surface or edge of enclosure 311 to secure the field-replaceable unit in latched position, and in doing so, allow for a force to be applied along the face or first side of the unit, due to the reactive force resulting from deflection of the spring member. In one example, catch 503 could extend through an appropriately sized opening in enclosure 311 to engage an appropriate latching surface or edge of the enclosure, to hold the pivotable latch in vertical, latched position, as illustrated in FIGS. 4, 5A & 6A.

To summarize, disclosed herein is a latch mechanism for latching a unit within an enclosure. The latch mechanism includes a pivotable latch coupled to the unit via a pivot, the pivot being disposed at a first side of the unit; and a spring member associated with the enclosure, and engaged by a first end of the pivotable latch with rotating of the latch from an open position to a latched position during latching of the unit within the enclosure. The pivotable latch includes the first end a second end, and the pivot is disposed closer to the first end than the second end thereof. In one embodiment, the pivotable latch is a non-compliant latch, such as an elongate, hard plastic arm. Rotating of the latch from the open position to the latched position during latching of the unit within the enclosure results in the latch engaging and deflecting the spring member. This engaging and deflection of the spring member facilitates provision of a positive pressure by the latch mechanism on the unit via the pivotable latch engaging a first side of the unit. The positive pressure is translated towards a second side of the unit opposite to the first side thereof with latching of the unit within the enclosure.

In one embodiment, the spring member is a deflectable spring member, such as a tension spring member, with a portion (e.g., a base) thereof engaged by the first end of the pivotable latch with rotating of the latch from the open position to the latched position during latching of the unit within the enclosure. For instance, the first end of the pivotable latch may pull on the spring member in a direction opposite to a direction of the positive pressure on the unit directed towards the second side of the unit with latching of the unit within the enclosure.

The spring member may include a first spring end and a second spring end, wherein the first and second spring ends engage respective contact surfaces associated with the enclosure, and slide relative to the respective contact surfaces with pulling of the spring member by the latch during latching of the unit within the enclosure. In one example, the first spring end and the second spring end of the spring member comprise a first curved spring end and a second curved spring end, respectively, which slidably move in different directions with deflection of the spring member by the latch.

As one specific example, the spring member may be a substantially G-shaped, curved spring member, with the portion of the spring member engaged by the latch being, for instance, a flat base portion of the substantially G-shaped, curved spring member. For instance, the spring member may extend from the base past a first contact surface of the respective contact surfaces, and curve back towards the first contact surface, with the first curved spring end slidably contacting the first contact surface, and the spring member may extend from the base past a second contact surface of the respective contact surfaces, and curve back towards the second contact surface, with the second curved spring end slidably contacting the second contact surface.

In implementation, the spring member may be disposed within a recess in the enclosure or a structure affixed to the enclosure, for instance, above or below a unit-receiving slot in the enclosure into which the unit is inserted and latched. Note in this regard that, although depicted as being below the unit-receiving slot, the spring member disclosed herein could be above the unit-receiving slot, with the latch arm lifting up in an open position, and being pivoted downwards into a latched position, that is, in another embodiment. As noted, the pivotable latch includes a releasable catch adjacent to the second end thereof, which is operable to engage, for instance, a surface or structure associated with the enclosure, to facilitate latching of the unit within the enclosure, with the positive pressure being maintained on the unit by the pivotable latch. For instance, the catch could extend through a respective opening in the enclosure to engage an appropriate latching surface or edge of the enclosure.

In one embodiment, at least one first connector of a connector assembly is disposed at the second side of the unit, and the positive pressure applied across the unit with latching of the unit within the enclosure facilitates secure coupling of the at least one first connector to at least one second connector associated with the enclosure. For instance, the at least one second connector may be disposed on a board, such as a mid-plane of an electronic assembly within the enclosure. As one example, the unit may be a field-replaceable unit, the enclosure an electronics enclosure, and the spring member a tension spring disposed within a recess within the enclosure below a unit-receiving slot of the enclosure into which the unit is inserted and latched.

Advantageously, the positive pressure or pre-load applied by the latch mechanism is designed to, in part, ensure fixed mechanical and electrical connection of, for example, at least one first connector associated with the field-replaceable unit, and at least one second connector associated with, for instance, a back plane or mid-plane within the enclosure. More particularly, this positive pressure may advantageously ensure, for example, that during shipping or operation, any vibration of the electronic subsystem does not cause connector contacts to move in relation to each other, which might otherwise cause wearing of the contacts (e.g., wearing of a plating thereon), and possibly result in failure or intermittent failure of the electronic subsystem. Still further, the latch mechanism disclosed herein advantageously provides positive pressure along the first side of the field-replaceable unit, towards a docked or latched position of the unit within the corresponding FRU-receiving slot, without use of any components which would require an operator to use a tool.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method comprising:
providing a pivotable latch coupled to a unit via a pivot, the pivot being disposed at a first side of the unit, and the unit to be latched within an enclosure; and
providing a spring member associated with the enclosure and separate from the pivotable latch, the spring member being contacted by and having a tension force applied thereto by, a first end of the pivotable latch with rotating of the pivotable latch from an open position to a latched position during latching of the unit within the enclosure, the pivotable latch comprising the first end and a second end, the pivot being disposed closer to the first end than the second end thereof, and the rotating of the pivotable latch from the open position to the latched position during latching of the unit within the enclosure resulting in the pivotable latch contacting the spring member and deflecting a first end and a second end of the spring member further apart, in opposite directions relative to respective contact surfaces of the enclosure contacted by the first end and the second end of the spring member, thereby facilitating provision of a positive pressure on the unit by the pivotable latch directed towards a second side of the unit opposite to the first side thereof with latching of the unit within the enclosure.

2. The method of claim 1, wherein the spring member comprises a deflectable spring member with a portion thereof physically contacted by the first end of the pivotable latch with rotating of the pivotable latch from the open position to the latched position during latching of the unit within the enclosure, the first end of the pivotable latch pulling on the spring member in a direction opposite to a direction of the positive pressure on the unit directed towards the second side of the unit with latching of the unit within the enclosure.

3. The method of claim 2, wherein the first end and the second end of the spring member physically engage the respective contact surfaces associated with the enclosure and slide relative to the respective contact surfaces with pulling of the spring member by the pivotable latch during latching of the unit within the enclosure.

4. The method of claim 3, wherein the first end and the second end of the spring member comprise a first curved spring end and a second curved spring end, respectively, and wherein the first and second ends slidably deflect in opposite directions on the first and second contact surfaces with pulling of the spring member by the pivotable latch during latching of the unit within the enclosure.

5. The method of claim 4, wherein the portion of the spring member engaged by the pivotable latch is a base of the spring member, and the spring member extends from the base past a first contact surface of the respective contact surfaces, and curves back towards the first contact surface with the first curved spring end slidably contacting the first contact surface, and the spring member extends from the base past a second contact surface of the respective contact surfaces, and curves back towards the second contact surface with the second curved spring end slidably contacting the second contact surface.

6. The method of claim 3, wherein the spring member is a substantially G-shaped, curved spring member, with the portion of the spring member engaged by the pivotable latch being a flat base portion of the substantially G-shaped, curved spring member.

7. The method of claim 3, wherein the spring member is disposed within a recess within the enclosure below a unit-receiving slot of the enclosure into which the unit is inserted and latched.

8. The method of claim 1, wherein providing the pivotable latch further comprises providing a catch at the second end thereof, the catch engaging a surface of the enclosure with latching of the unit within the enclosure to facilitate the latching of the unit within the enclosure, with the positive pressure being maintained on the unit by the pivotable latch.

9. The method of claim 1, wherein at least one first connector is disposed at the second side of the unit, and the positive pressure applied across the unit with latching of the unit within the enclosure facilitates secure coupling of the at least one first connector to at least one second connector associated with the enclosure.

10. The method of claim 1, wherein the unit is a field-replaceable unit, the enclosure is an electronics enclosure, and the spring member comprises a tension spring disposed within a recess within the enclosure below a unit-receiving slot of the enclosure into which the unit is inserted and latched.

11. A method of facilitating secure latching of a field-replaceable unit (FRU) within an enclosure, the method comprising:
providing a latch mechanism to facilitate secure latching of the field-replaceable unit within the enclosure, the latch mechanism comprising:
a pivotable latch coupled to the field-replaceable unit via a pivot, the pivot being disposed at a first side of the field-replaceable unit; and
a spring member associated with the enclosure and separate from the pivotable latch, the spring member being contacted by, and having a tension force applied thereto by, a first end of the pivotable latch with rotating of the pivotable latch from an open position to a latched position during latching of the field-replaceable unit within the enclosure, the pivotable latch comprising the first end and a second end, the pivot being disposed closer to the first end than the second end thereof, and the rotating of the pivotable latch from the open position to the latched position during latching of the field-replaceable unit within the enclosure resulting in the pivotable latch contacting the spring member and deflecting a first end and a second end of the spring member farther apart, in opposite directions relative to respective contact surfaces of the enclosure contacted by the first end and the second end of the spring member, thereby facilitating provision of a positive pressure on the field-replaceable unit by the pivotable latch directed towards a second side of the field-replaceable unit opposite to the first side thereof with latching of the field-replaceable unit within the enclosure.

12. The method of claim 11, wherein the spring member comprises a deflectable spring member with a portion thereof physically contacted by the first end of the pivotable latch with rotating of the pivotable latch from the open position to the latched position during latching of the field-replaceable unit within the enclosure, the first end of the pivotable latch pulling on the spring member in a direction opposite to a direction of the positive pressure on the unit directed towards the second side of the unit with latching of the unit within the enclosure.

13. The method of claim 12, wherein the first end and the second end of the spring member physically engage the respective contact surfaces associated with the enclosure and slide relative to the respective contact surfaces with pulling of the spring member by the pivotable latch during latching of the unit within the enclosure.

14. The method of claim 13, wherein the portion of the spring member engaged by the pivotable latch is a base of the spring member, the first end and the second end of the spring member comprise a first curved spring end and a second curved spring end, respectively, and the spring member extends from the base past a first contact surface of the respective contact surfaces, and curves back towards the first contact surface with the first curved spring end slidably contacting the first contact surface, and the spring member extends from the base past a second contact surface of the respective contact surfaces, and curves back towards the second contact surface with the second curved spring end slidably contacting the second contact surface.

* * * * *